(12) United States Patent
Kobayashi et al.

(10) Patent No.: US 9,899,818 B2
(45) Date of Patent: Feb. 20, 2018

(54) CIRCUIT ASSEMBLY AND ELECTRICAL JUNCTION BOX

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

(72) Inventors: Takehito Kobayashi, Mie (JP); Yoshikazu Sasaki, Mie (JP); Shigeki Yamane, Mie (JP); Tomohiro Ooi, Mie (JP); Yukinori Kita, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 15/306,661

(22) PCT Filed: Apr. 27, 2015

(86) PCT No.: PCT/JP2015/062674
§ 371 (c)(1),
(2) Date: Oct. 25, 2016

(87) PCT Pub. No.: WO2015/174263
PCT Pub. Date: Nov. 19, 2015

(65) Prior Publication Data
US 2017/0054283 A1 Feb. 23, 2017

(30) Foreign Application Priority Data
May 14, 2014 (JP) ................................ 2014-100258

(51) Int. Cl.
H01G 4/228 (2006.01)
H01G 9/10 (2006.01)
(Continued)

(52) U.S. Cl.
CPC ............. *H02G 3/16* (2013.01); *H05K 1/0203* (2013.01); *H05K 1/181* (2013.01); *H05K 7/06* (2013.01);
(Continued)

(58) Field of Classification Search
USPC .......................................... 174/520; 361/761
See application file for complete search history.

(56) References Cited

FOREIGN PATENT DOCUMENTS

JP 2005-080354 A 3/2005
JP 2005-117719 A 4/2005
(Continued)

*Primary Examiner* — Andargie M Aychillhum
(74) *Attorney, Agent, or Firm* — Dinsmore & Shohl LLP (57) ABSTRACT

Provided is a circuit assembly that includes a circuit board that has a connection opening, a plurality of busbars that are laminated on one surface side of the circuit board via an adhesive sheet, a coil that has a main portion and a plurality of lead terminals, the coil being arranged on the other surface side of the circuit board by the lead terminals being connected to the plurality of busbars that are exposed through the connection opening, and a heatsink that is laminated on a side of the plurality of busbars that is opposite to the circuit board via an adhesive agent. The adhesive sheet has sheet openings through which the plurality of busbars are exposed and the plurality of lead terminals are connected to the plurality of busbars, the adhesive sheet covering a gap between the plurality of busbars, the gap being located in the connection opening.

2 Claims, 7 Drawing Sheets

(51) Int. Cl.
- *H05K 5/03* (2006.01)
- *H02G 3/16* (2006.01)
- *H05K 7/06* (2006.01)
- *H05K 1/02* (2006.01)
- *H05K 1/18* (2006.01)
- *H05K 7/20* (2006.01)

(52) U.S. Cl.
CPC . *H05K 7/20854* (2013.01); *H05K 2201/1003* (2013.01); *H05K 2201/10015* (2013.01); *H05K 2201/10022* (2013.01); *H05K 2201/10272* (2013.01)

(56) References Cited

FOREIGN PATENT DOCUMENTS

| JP | 2005-228799 A | | 8/2005 |
|----|---------------|---|--------|
| JP | 2013-099071   | * | 5/2013 |
| JP | 2013-099071 A | | 5/2013 |

* cited by examiner

CIRCUIT ASSEMBLY AND ELECTRICAL JUNCTION BOX

CROSS-REFERENCE TO RELATED APPLICATIONS

This application is the U.S. national phase of PCT/JP2015/062674 filed Apr. 27, 2015, which claims priority of Japanese Patent Application JP 2014-100258 filed May 14, 2014.

FIELD OF THE INVENTION

The technique disclosed in the present description relates to a circuit assembly, and an electrical junction box.

BACKGROUND OF THE INVENTION

Conventionally, devices in which a circuit assembly including a circuit board on which various electronic components are mounted is accommodated in a case are known as devices for energizing and de-energizing in-car electric components.

In such devices, the electronic components mounted on the circuit board are small and have superior functionality.

However, these electronic components have a relatively large heat generation, and thus if heat generated by the electronic components stays in the case, there will be a risk that the temperature in the case increases and the performance of the electronic components accommodated in the case decreases.

Figure 7:
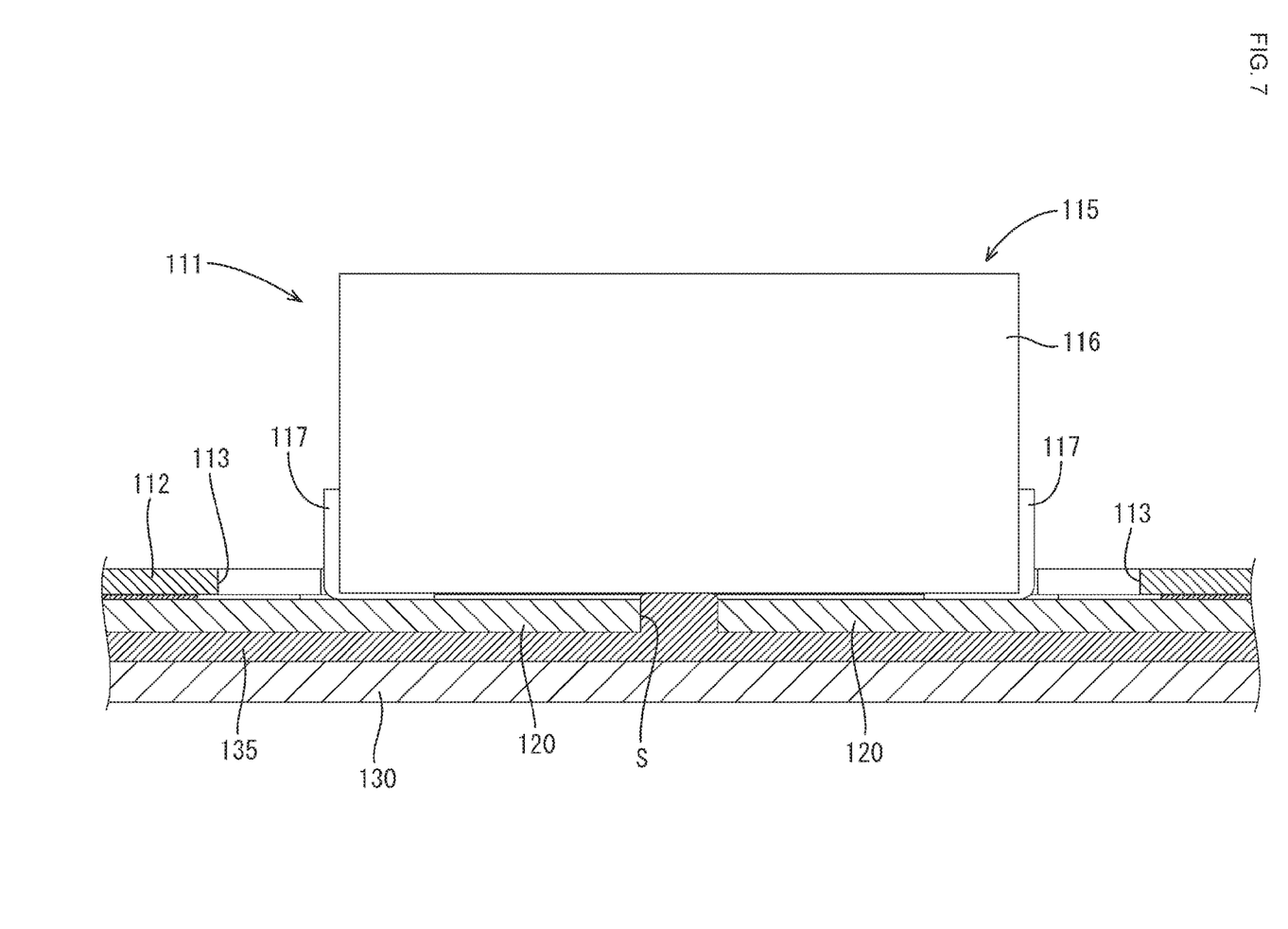
FIG. 7 is a partial cross-sectional view taken along the line B-B of FIG. 6.

Accordingly, as an example of various structures for discharging the heat generated by the circuit board or the electronic components, a circuit assembly 111 as shown in FIG. 7 is conceivable that has a configuration in which a heat discharging member 130 is provided on that surface of a circuit board 112 that is opposite to the surface on which an electronic component 115 is provided.

Figure 6:
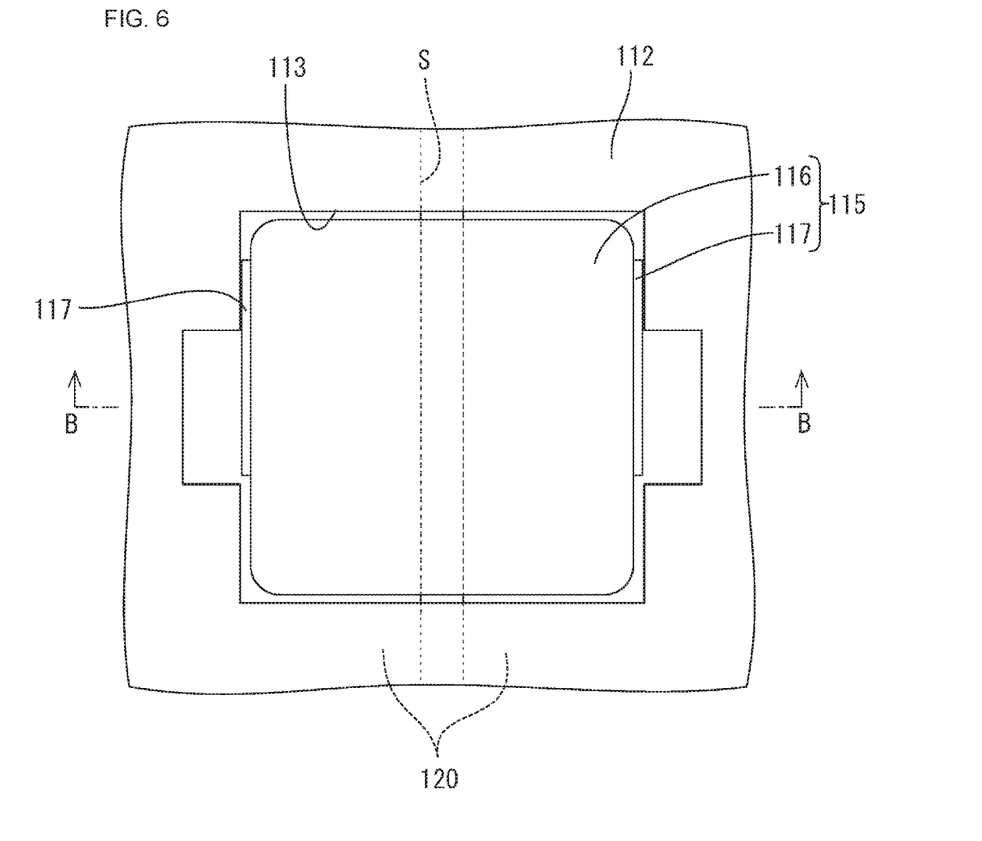
FIG. 6 is a partially enlarged plan view illustrating the state in which the coil is connected to the busbars, according to a hypothetical technique.

On the other hand, as shown in FIGS. 6 and 7, it is also conceivable that an opening 113 is formed in a region of the circuit board 112 that corresponds to the electronic component 115, a plurality of busbars 120 are provided on that surface of the circuit board 112 that is opposite to the surface on which the electronic component 115 is provided, and terminals 117 of the electronic component 115 are connected to the busbars 120 exposed through the opening 113. By configuring an electric power circuit with the plurality of busbars 120, it is possible to flow a high current through the electric power circuit.

However, when the electronic component 115 is connected to the plurality of busbars 120 via the opening 113 formed in the circuit board 112, an adhesive agent 135 for bonding the heat discharging member that is laminated on the surfaces of the busbars 120 that are opposite to the circuit board 112 may enter a gap S between adjacent busbars 120, and may get into contact with a lower surface of a main portion 116 of the electronic component 115, as shown in FIG. 7. In such a situation, if the adhesive agent 135 expands due to the heat generated by the circuit board 112 or the electronic component 115, or adversely contracts by being cooled, the electronic component 115 will be pushed or drawn by the adhesive agent 135, possibly causing a connection failure such as a crack in a connection section between the terminal 117 and the busbar 120.

The technique disclosed in the present description was made in view of the above-described circumstances, and it is an object thereof to provide a circuit assembly and an electrical junction box that have high connection reliability.

SUMMARY

According to the technique disclosed in the present description, a circuit assembly includes: a circuit board that has a connection opening; a plurality of busbars that are laminated on one surface side of the circuit board via an adhesive sheet; an electronic component that has a main portion and a plurality of lead terminals, the electronic component being arranged on the other surface side of the circuit board by the lead terminals being connected to the plurality of busbars that are exposed through the connection opening; and a heatsink that is laminated on a side of the plurality of busbars that is opposite to the circuit board via an adhesive agent, wherein the adhesive sheet has sheet openings through which the plurality of busbars are exposed and the plurality of lead terminals are connected to the plurality of busbars, the adhesive sheet covering a gap between the plurality of busbars, the gap being located in the connection opening.

According to the technique disclosed in the present description, since the gap between adjacent busbars in the connection opening is covered with the adhesive sheet, the adhesive agent that has entered the gap is prevented from getting into direct contact with the lower surface of the main portion of the electronic component. Furthermore, since the adhesive sheet thus arranged has an effect of confining the adhesive agent in the gap, it is possible to reduce the influence of the adhesive agent on the electronic component, as compared with a case where no adhesive sheet is provided. Accordingly, it is possible to achieve a circuit assembly and an electrical junction box that have high connection reliability.

The technique disclosed in the present description relates to an electrical junction box in which the circuit assembly is accommodated in a case.

According to the technique disclosed in the present description, it is possible to achieve a circuit assembly or an electrical junction box that have improved connection reliability.

DETAILED DESCRIPTION

An embodiment will be described with reference to FIGS. 1 to 5.

An electrical junction box 10 of the present embodiment is provided with a circuit assembly 11 including a circuit board 12 and a heatsink 30, and a synthetic resin case 40 that accommodates the circuit assembly 11. Note that in the following description, the upper side of FIG. 1 refers to "front side" or "upper side", and the lower side of FIG. 1 refers to "rear side" or "lower side".

Figure 1:
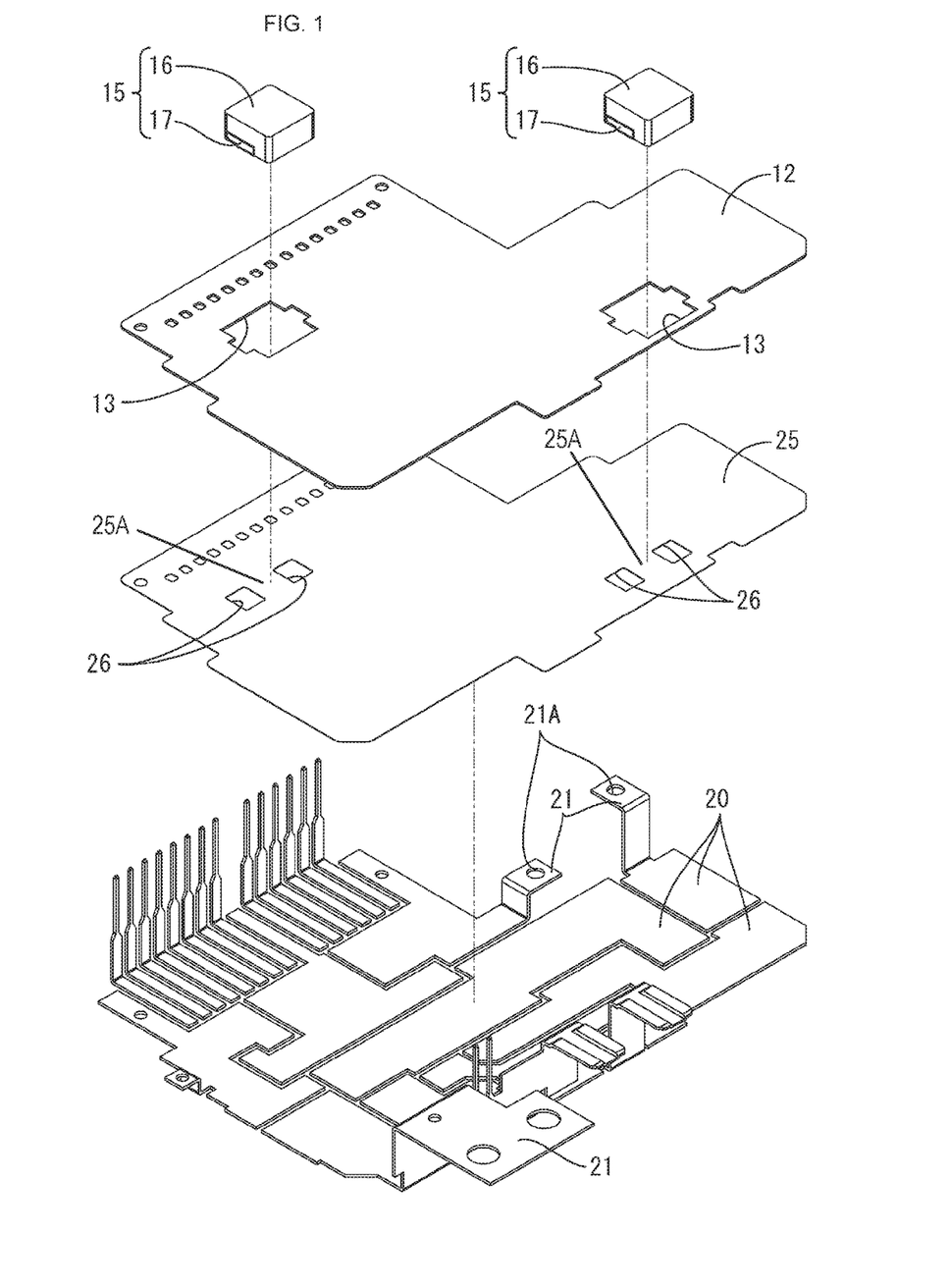
FIG. 1 is an exploded perspective view illustrating a part of a circuit assembly of one embodiment.
Figure 2:
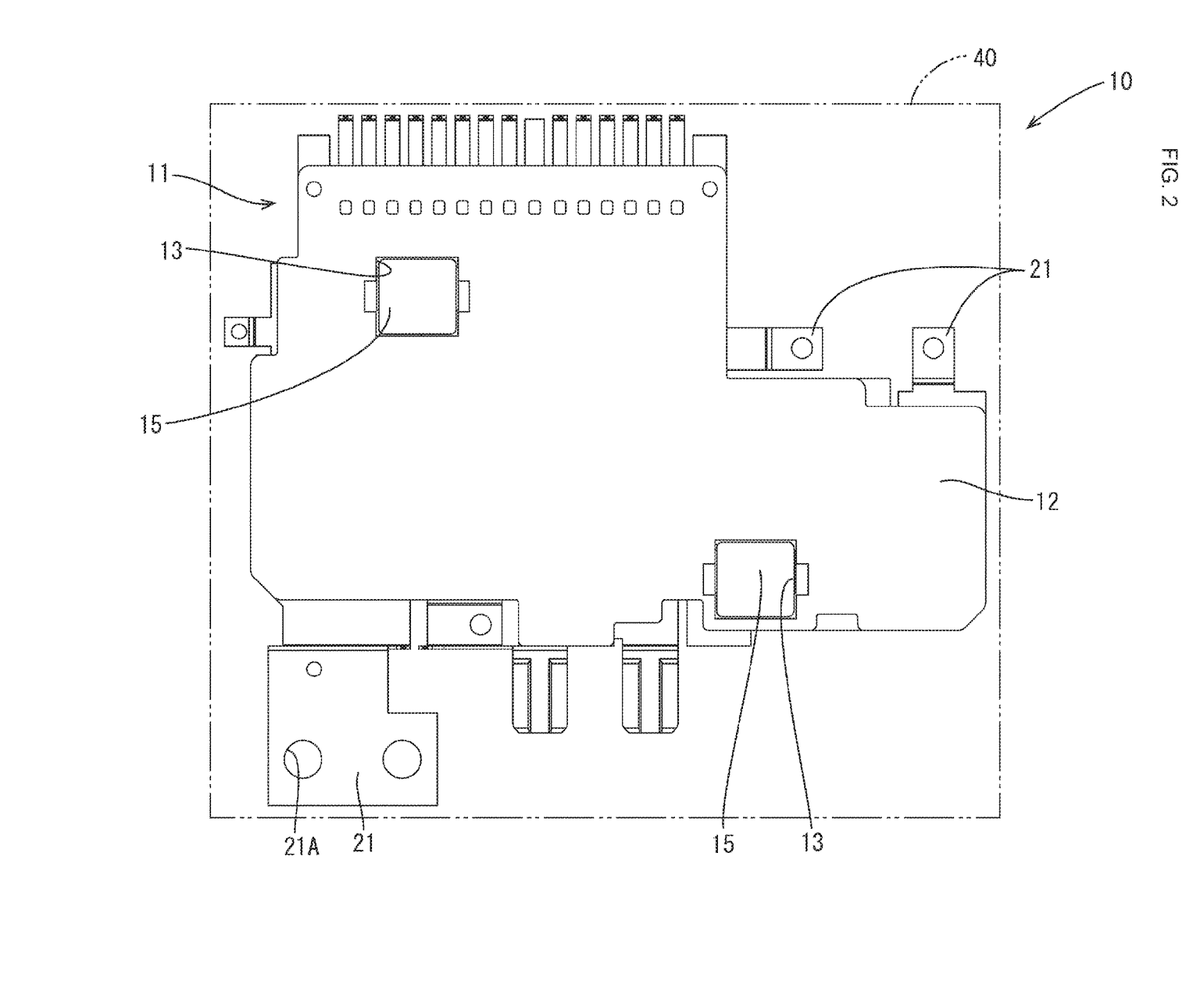
FIG. 2 is a plan view illustrating the inside of an electrical junction box.

As shown in FIG. 1, the circuit assembly 11 is provided with the circuit board 12, coils 15 (an example of electronic component) that are arranged on the front surface (upper side of FIG. 1) of the circuit board 12, a plurality of busbars 20 that are arranged on the rear surface (lower side of FIG. 1) of the circuit board 12, and the heatsink 30 (see FIG. 5) that is arranged on the rear surfaces of the busbars 20.

The circuit board 12 is substantially L-shaped, and has, on its front surface, a conductive circuit that is not shown and is achieved by printed wiring.

Figure 5:
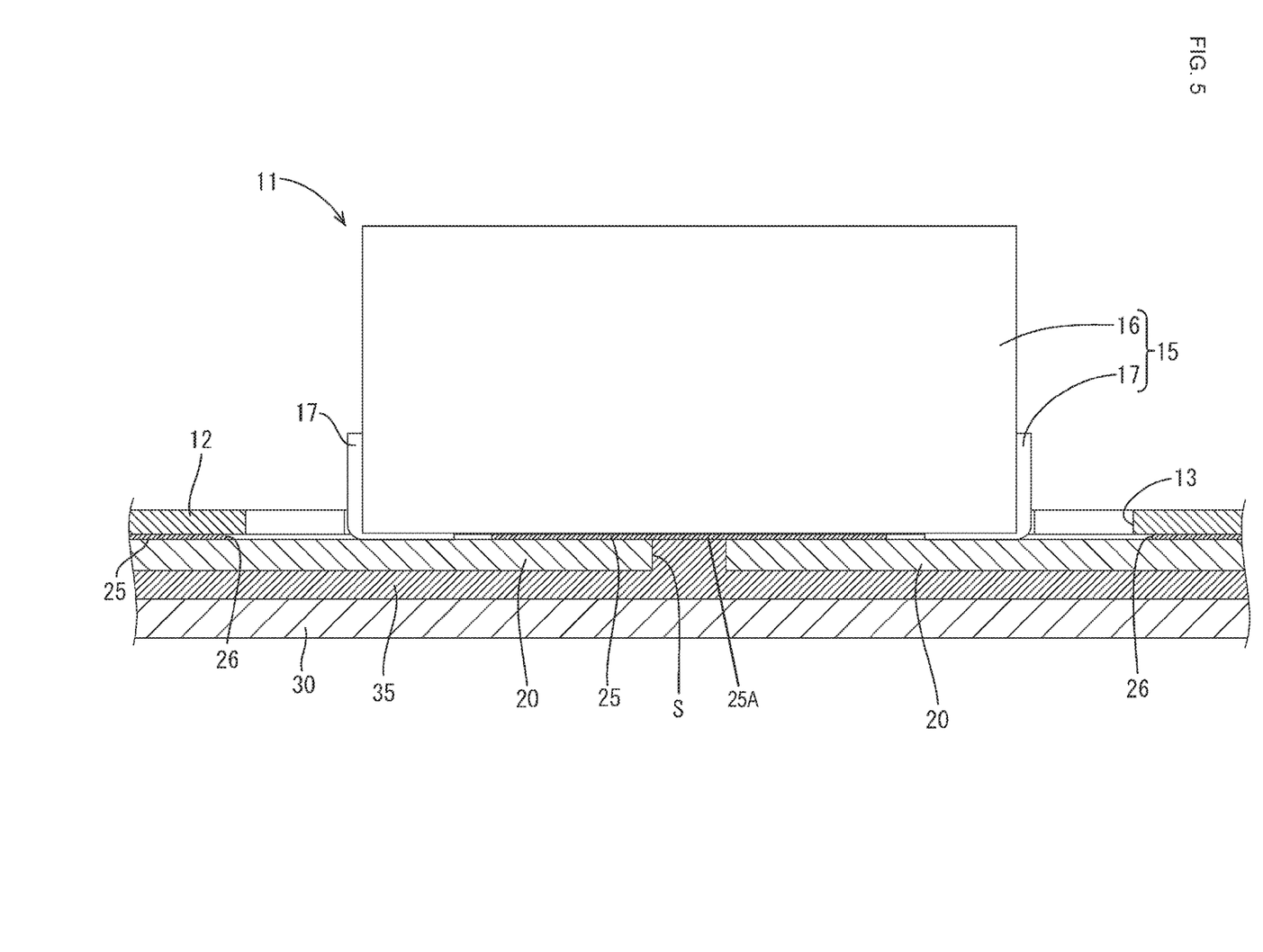
FIG. 5 is a partial cross-sectional view taken along the line A-A of FIG. 4.

As shown in FIGS. 1 and 5, each coil 15 is a surface-mounted coil, and has a main portion 16 in the shape of a rectangular parallelepiped, and a pair of lead terminals 17 provided in the vicinity of the edges of two opposing sides of the bottom surface of the main portion 16.

The plurality of busbars 20 are formed by pressing a metal plate into predetermined shapes. The busbars 20 are substantially rectangular, and are arranged in a predetermined pattern with a gap S between adjacent busbars 20. Some busbars 20 have, on an edge thereof, a connecting piece 21 that protrudes outward and is formed as one piece with the corresponding busbar 20. Each connecting piece 21 has a bolt mounting hole 21A through which a bolt is inserted, and is electrically connected to an external power supply, the bolt (not shown) being inserted through the bolt mounting hole 21A and being screwed to a power supply terminal mounted on a vehicle.

The plurality of busbars 20 are adhered to the rear surface of the circuit board 12 via an insulating adhesive sheet 25. The outer shape of the adhesive sheet 25 is substantially the same as the outer shape of the circuit board 12.

Figure 3:
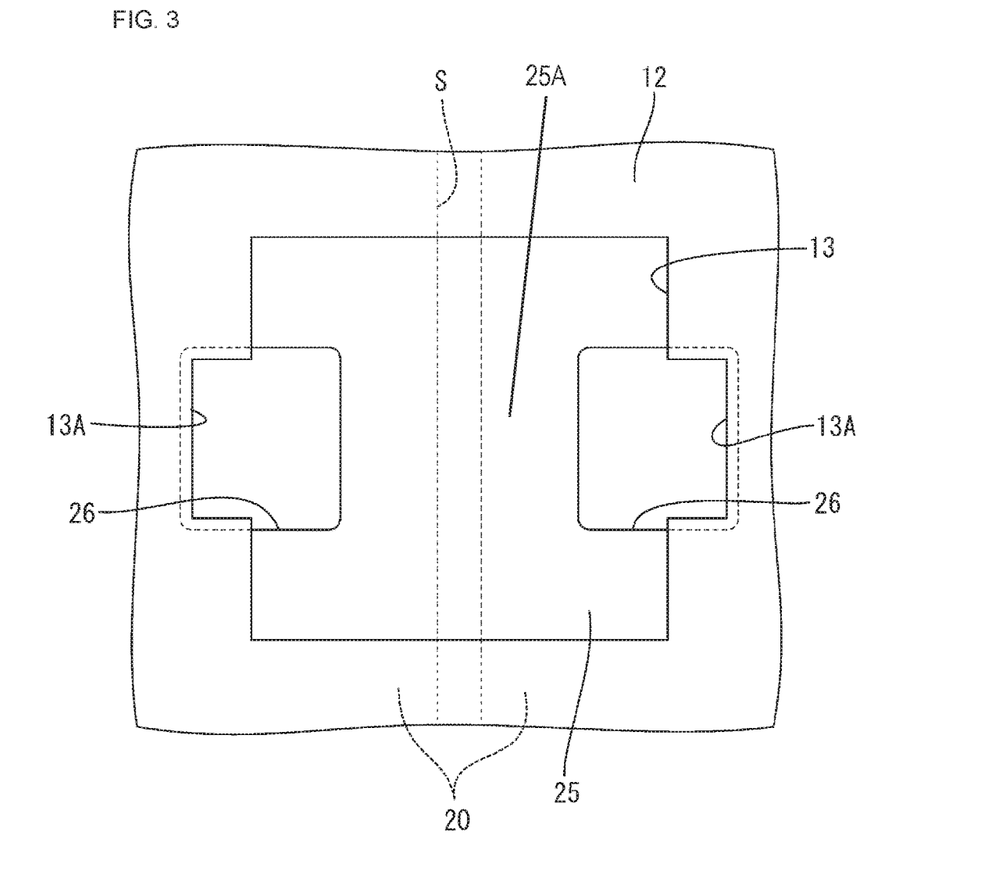
FIG. 3 is a partially enlarged plan view illustrating a connection opening before a coil is arranged.
Figure 4:
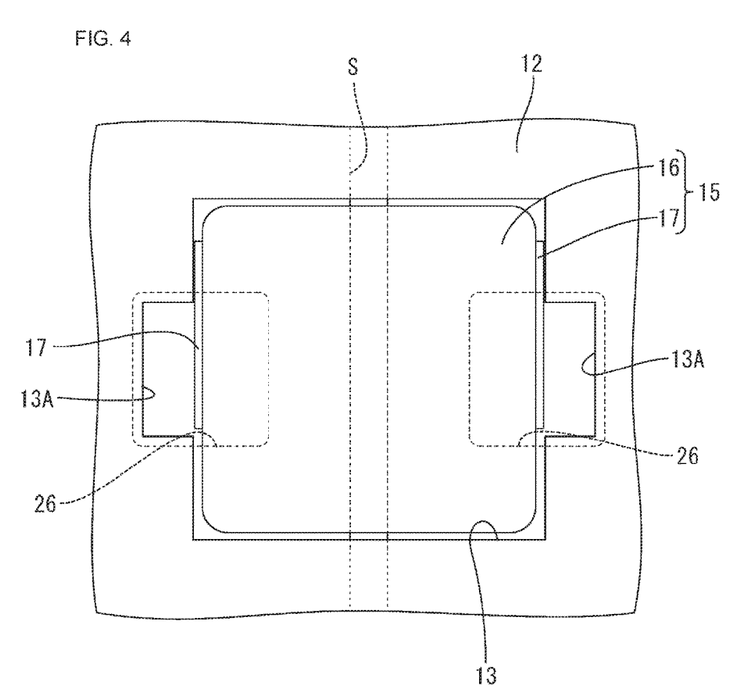
FIG. 4 is a partially enlarged plan view illustrating the state in which a coil is connected to the busbars.

As shown in FIG. 1, the circuit board 12 has connection openings 13 for mounting the coils 15 on the busbars 20 at positions at which the coils 15 are arranged. As shown in FIG. 4, a part of each connection opening 13 through which the main portion 16 of the coil 15 is arranged opens in the shape of a rectangle that is slightly larger than the bottom surface of the main portion 16. Furthermore, openings with a small width (hereinafter, referred to as extended portions 13A and referenced in FIGS. 3 and 4) are formed extending from a pair of edges on which the lead terminals 17 of the coil 15 are located. A part of a pair of busbars 20 is arranged in the connection opening 13.

On the other hand, the adhesive sheet 25 has pairs of sheet openings 26 for mounting the lead terminals 17 of the coils 15 on the busbars 20. The pair of sheet openings 26 are spaced apart from each other so as to define a support portion 25A. As shown in FIG. 3, the sheet openings 26 are substantially square openings, and one pair of sheet openings 26 are formed at positions at which parts of them overlap a pair of extended portions 13A. More specifically, each sheet opening 26 is formed such that a part of its opening edge is located slightly outward away from the opening edge of the extended portion 13A (so as to have a slightly larger opening size), and exposes a part of the busbar 20 in the connection opening 13 of the circuit board 12.

Furthermore, the sheet openings 26 are formed so that their opening edges in the connection openings 13 do not extend to a gap S between adjacent busbars 20. In other words, within the connection openings 13, the support portion 25A of adhesive sheet 25 covers the gaps S between adjacent busbars 20 from the upper side.

The coils 15 are arranged on the front surface side of the circuit board 12, namely, in the regions in which the connection openings 13 are formed. In the present embodiment, the lead terminals 17 of the coils 15 are connected to the surfaces of the busbars 20 that are exposed through the connection opening 13 and the sheet opening 26 by a well-known method such as soldering.

The heatsink 30 is arranged on the lower surfaces (rear surfaces) of the busbars 20 (see FIG. 5). The heatsink 30 is a plate-shaped member that is made of a metal material such as aluminum or an aluminum alloy that is excellent in heat conductivity, and has the function to discharge heat generated in the circuit board 12 and the coils 15. The heatsink 30 is adhered to the rear surface side of the busbars 20 with, for example, a thermosetting adhesive agent 35. The adhesive agent 35 is an adhesive agent that is insulating and has heat conductivity.

The following will describe an example of a method for manufacturing the electrical junction box 10 according to the present embodiment. First, as shown in FIG. 1, the adhesive sheet 25 cut in a predetermined shape is laid on the lower surface of the circuit board 12 on whose front surface an electrically conducting path is formed by printed wiring, and the plurality of busbars 20 arranged in a predetermined pattern are pressed thereto. Accordingly, the circuit board 12 and the plurality of busbars 20 are adhered and fixed to each other via the adhesive sheet 25. In this state, parts of the upper surfaces of the plurality of busbars 20 (regions in which the lead terminals 17 of the coils 15 are to be mounted) are exposed through the connection openings 13 of the circuit board 12 and the sheet openings 26 of the adhesive sheet 25.

Then, solder is applied to predetermined positions of the circuit board 12 by screen printing. Then, the coils 15 are placed at the predetermined positions, and reflow soldering is performed.

Then, the adhesive agent 35 is applied to the upper surface of the heatsink 30, and the circuit board 12 on which the coils 15 and the plurality of busbars 20 are arranged is laid thereon from above. Since, at this time, the gaps S between adjacent busbars 20 that are located in the connection openings 13 of the circuit board 12 are covered with the adhesive sheet 25, the adhesive agent 35 that has entered the gaps S is prevented from getting in direct contact with the lower surfaces of the main bodies 16 of the coils 15 (see FIG. 5). Thereafter, the adhesive agent 35 is cured by application of heat.

Lastly, the circuit board 12 (circuit assembly) laid on the heatsink 30 is accommodated in the case 40, and the electrical junction box 10 is obtained.

The following will describe the functions and effects of the electrical junction box 10 according to the present embodiment. According to the present embodiment, even if the adhesive agent 35 enters the gaps S between adjacent busbars 20 in the connection openings 13, the adhesive agent 35 will be confined in the gaps S by the adhesive sheet 25. Accordingly, even if the adhesive agent 35 expands due to heat, or adversely contracts, it is possible to reduce the influence of the adhesive agent 35 on the coils 15, as compared with a case where no adhesive sheet 25 is provided. That is, it is possible to achieve the circuit assembly and the electrical junction box that have high connection reliability.

Other Embodiments

The technique disclosed by the present description is not limited to the embodiment described in the foregoing description and drawings, and encompasses, for example, the following various aspects.

(1) The foregoing embodiment has a configuration in which a pair of lead terminals 17 are connected to the busbars 20, but a configuration is also possible in which one of the lead terminals 17 is connected to an electrically-conducting path of the circuit board 12, and in this case, the adhesive sheet 25 needs only to have one sheet opening 26 for each pair of lead terminals 17.

(2) The positions, shape, and the number of the sheet openings 26 are not limited to those of the foregoing embodiment, and may be changed suitably. Any configuration is possible as long as the lead terminals 17 are connectable to the busbars 20, and the adhesive sheet 25 covers the gaps S between adjacent busbars 20.

(3) The foregoing embodiment has described an example in which the coils 15 are mounted, but the present invention is applicable to the case where, instead of the coils 15, other electronic components such as capacitors or shunt resistors are mounted.

The invention claimed is:

1. A circuit assembly comprising:
a circuit board that has a connection opening;
a plurality of busbars that are laminated on one surface side of the circuit board via an adhesive sheet;
an electronic component that has a main portion and a plurality of lead terminals, the lead terminals being connected to the plurality of busbars that are exposed through the connection opening; and
a heatsink that is laminated on a side of the plurality of busbars that is opposite to the circuit board via an adhesive agent,
wherein the adhesive sheet has a pair of sheet openings, each of the pair of sheet openings spaced apart from each other so as to define a support portion of the adhesive sheet, wherein the plurality of busbars are exposed through the pair of sheet openings and the plurality of lead terminals are connected to the plurality of busbars, the support portion of the adhesive sheet covering a gap between the plurality of busbars, the gap being located in the connection opening.

2. An electrical junction box comprising, the circuit assembly according to claim 1, and
a case in which the circuit assembly is accommodated.

* * * * *